United States Patent
Chang et al.

(10) Patent No.: US 11,961,919 B2
(45) Date of Patent: Apr. 16, 2024

(54) NANOSTRUCTURE FIELD-EFFECT TRANSISTOR DEVICE AND METHOD OF FORMING

(71) Applicant: Taiwan Semiconductor Manufacturing Co., Ltd., Hsinchu (TW)

(72) Inventors: Cheng-Chung Chang, Kaohsiung (TW); Hsiu-Hao Tsao, Taichung (TW); Ming-Jhe Sie, Taipei (TW); Shun-Hui Yang, Jungli (TW); Chen-Huang Huang, Hsinchu (TW); An Chyi Wei, Hsinchu (TW); Ryan Chia-Jen Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/699,477

(22) Filed: Mar. 21, 2022

(65) Prior Publication Data

US 2022/0209023 A1 Jun. 30, 2022

Related U.S. Application Data

(63) Continuation of application No. 15/931,717, filed on May 14, 2020, now Pat. No. 11,282,967.
(Continued)

(51) Int. Cl.
*H01L 29/786* (2006.01)
*H01L 21/02* (2006.01)
(Continued)

(52) U.S. Cl.
CPC .. *H01L 29/78696* (2013.01); *H01L 21/02532* (2013.01); *H01L 21/02603* (2013.01);
(Continued)

(58) Field of Classification Search
CPC ......... H01L 29/78696; H01L 21/02532; H01L 21/02603; H01L 29/0673; H01L 29/42392; H01L 29/66545
See application file for complete search history.

(56) References Cited

U.S. PATENT DOCUMENTS 11,282,967 B2 * 3/2022 Chang ............... H01L 29/66742
2010/0068862 A1 3/2010 Lee et al.
(Continued)

*Primary Examiner* — Brian Turner
(74) *Attorney, Agent, or Firm* — Slater Matsil, LLP

(57) ABSTRACT

A method of forming a semiconductor device includes: forming a fin protruding above a substrate, where a top portion of the fin comprises a layer stack that includes alternating layers of a first semiconductor material and a second semiconductor material; forming a dummy gate structure over the fin; forming openings in the fin on opposing sides of the dummy gate structure; forming source/drain regions in the openings; removing the dummy gate structure to expose the first semiconductor material and the second semiconductor material under the dummy gate structure; performing a first etching process to selectively remove the exposed first semiconductor material, where after the first etching process, the exposed second semiconductor material form nanostructures, where each of the nanostructures has a first shape; and after the first etching process, performing a second etching process to reshape each of the nanostructures into a second shape different from the first shape.

20 Claims, 13 Drawing Sheets

Related U.S. Application Data

(60) Provisional application No. 62/955,186, filed on Dec. 30, 2019.

(51) Int. Cl.
*H01L 21/3065* (2006.01)
*H01L 29/06* (2006.01)
*H01L 29/423* (2006.01)
*H01L 29/66* (2006.01)

(52) U.S. Cl.
CPC ...... *H01L 21/3065* (2013.01); *H01L 29/0673* (2013.01); *H01L 29/42392* (2013.01); *H01L 29/66545* (2013.01); *H01L 29/66553* (2013.01); *H01L 29/66742* (2013.01); *H01L 29/78618* (2013.01)

(56) References Cited

U.S. PATENT DOCUMENTS

| | | | |
|---|---|---|---|
| 2014/0197377 A1* | 7/2014 | Kim | H01L 21/823821 257/29 |
| 2016/0064289 A1* | 3/2016 | Xiao | H01L 21/02576 257/369 |
| 2016/0086861 A1 | 3/2016 | Kim | |
| 2016/0315167 A1* | 10/2016 | Nakamura | H01L 29/66742 |
| 2017/0345945 A1 | 11/2017 | Lee et al. | |
| 2018/0069006 A1 | 3/2018 | Kim et al. | |
| 2018/0166295 A1* | 6/2018 | Huang | H01L 21/67196 |
| 2019/0393350 A1* | 12/2019 | Thompson | H01L 29/66439 |
| 2020/0098575 A1* | 3/2020 | Takahashi | H01L 21/28556 |
| 2020/0312658 A1 | 10/2020 | Miura et al. | |
| 2020/0357911 A1* | 11/2020 | Frougier | H01L 29/42392 |
| 2021/0013224 A1 | 1/2021 | Purayath et al. | |

* cited by examiner

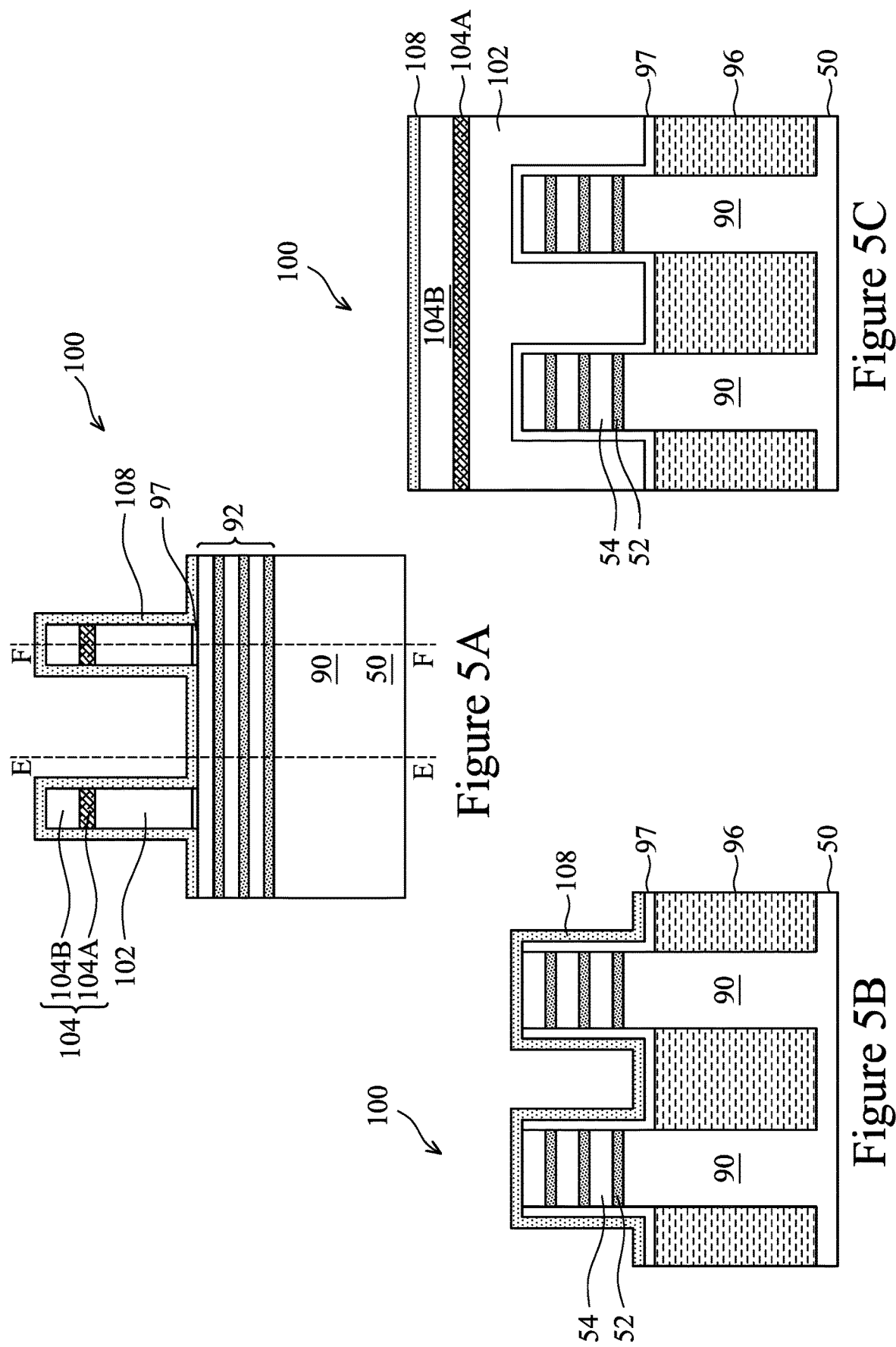

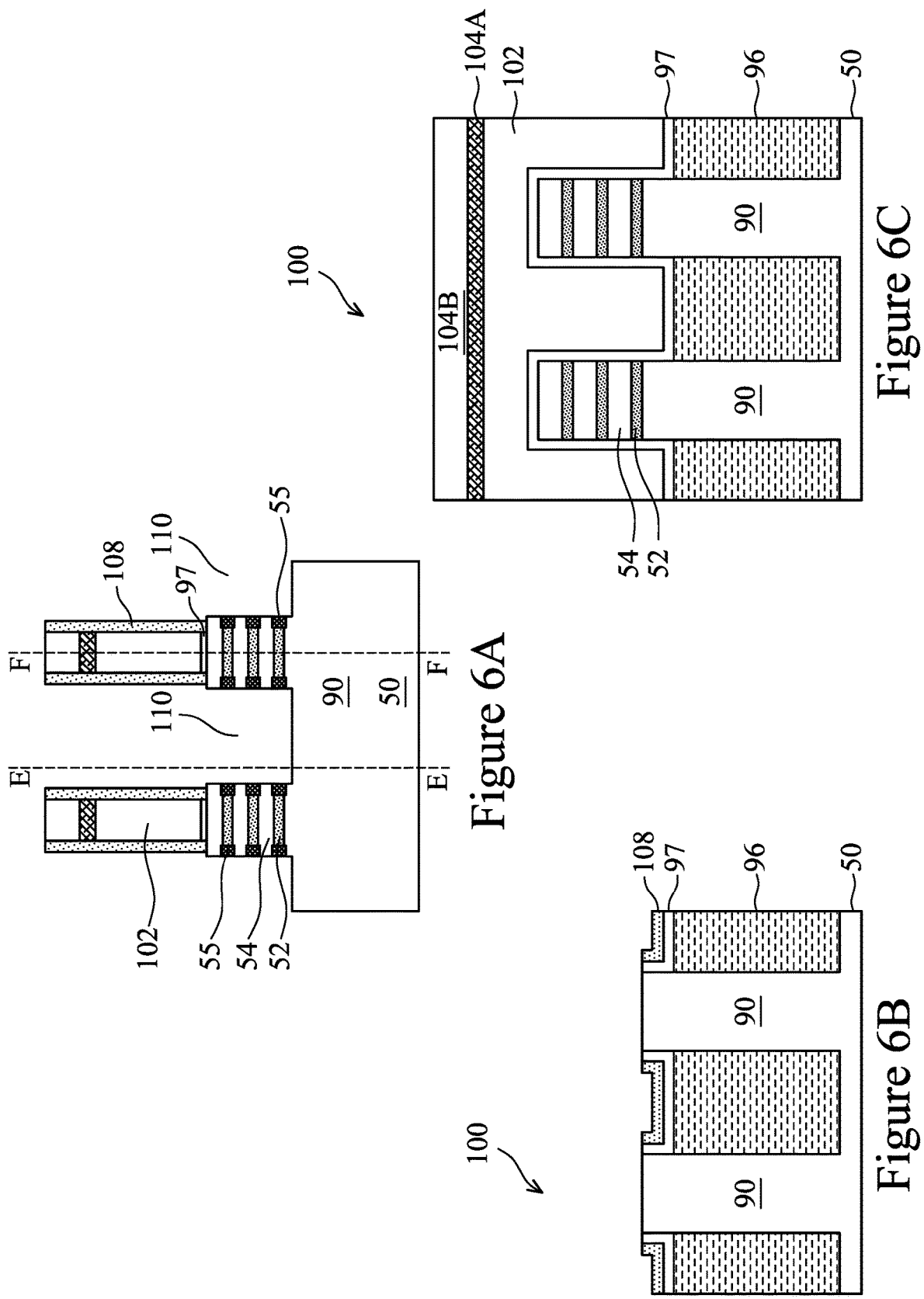

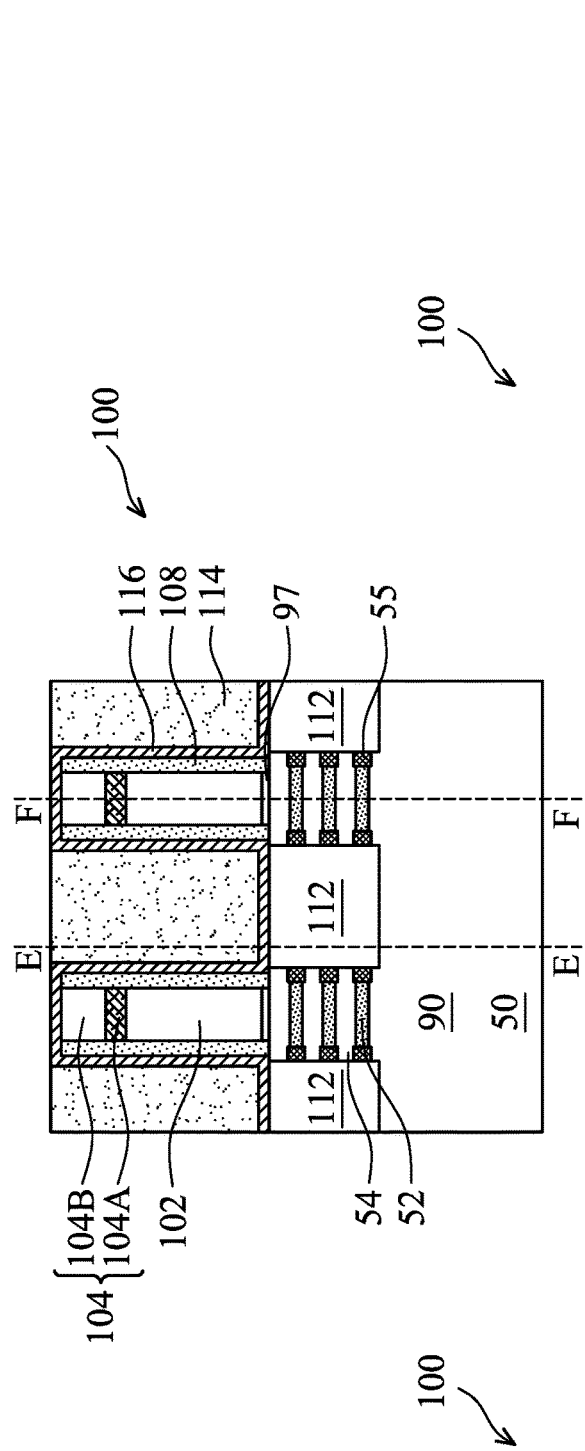
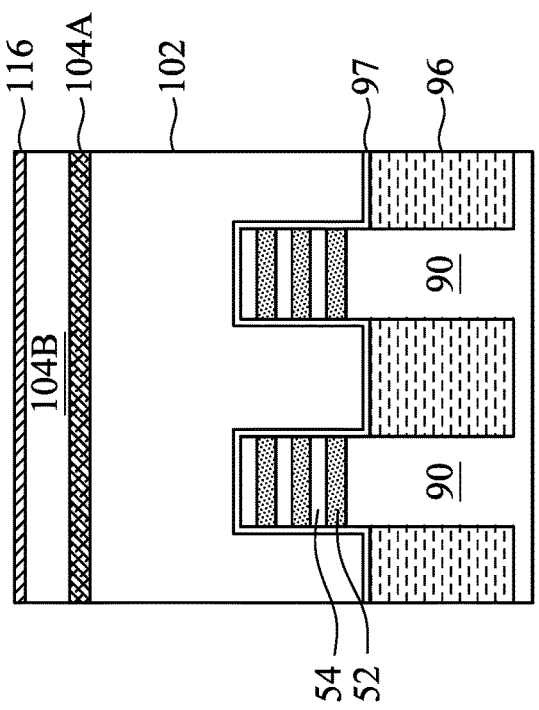
Figure 7A
Figure 7B
Figure 7C

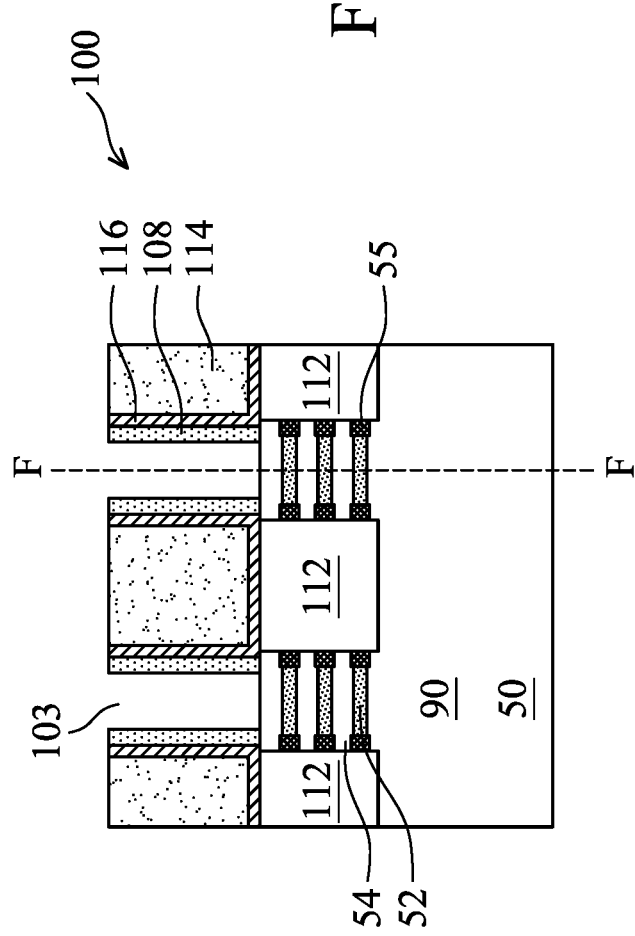
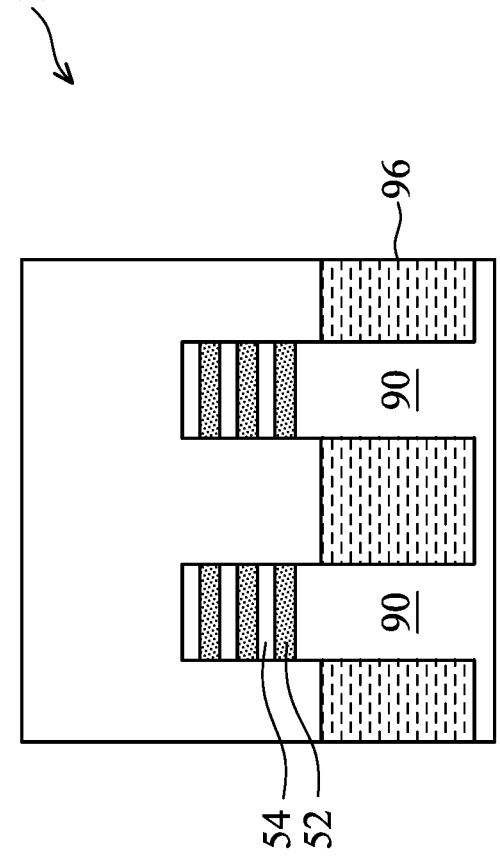

NANOSTRUCTURE FIELD-EFFECT TRANSISTOR DEVICE AND METHOD OF FORMING

PRIORITY CLAIM AND CROSS-REFERENCE

This application is a continuation of U.S. patent application Ser. No. 15/931,717, filed on May 14, 2020 and entitled "Nanostructure Field-Effect Transistor Device and Method of Forming," which claims the benefit of U.S. Provisional Application No. 62/955,186, filed on Dec. 30, 2019 and entitled "Nanosheet Field-Effect Transistor Device and Method of Forming," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4A, 4B, 5A-5C, 6A-6C, 7A-7C, 8A, 8B, 9A, 9B, 10A, 10B, 11A, 11B, 12A, and 12B are cross-sectional views of a nanostructure field-effect transistor device at various stages of manufacturing, in accordance with an embodiment.

DETAILED DESCRIPTION

Figure 1:
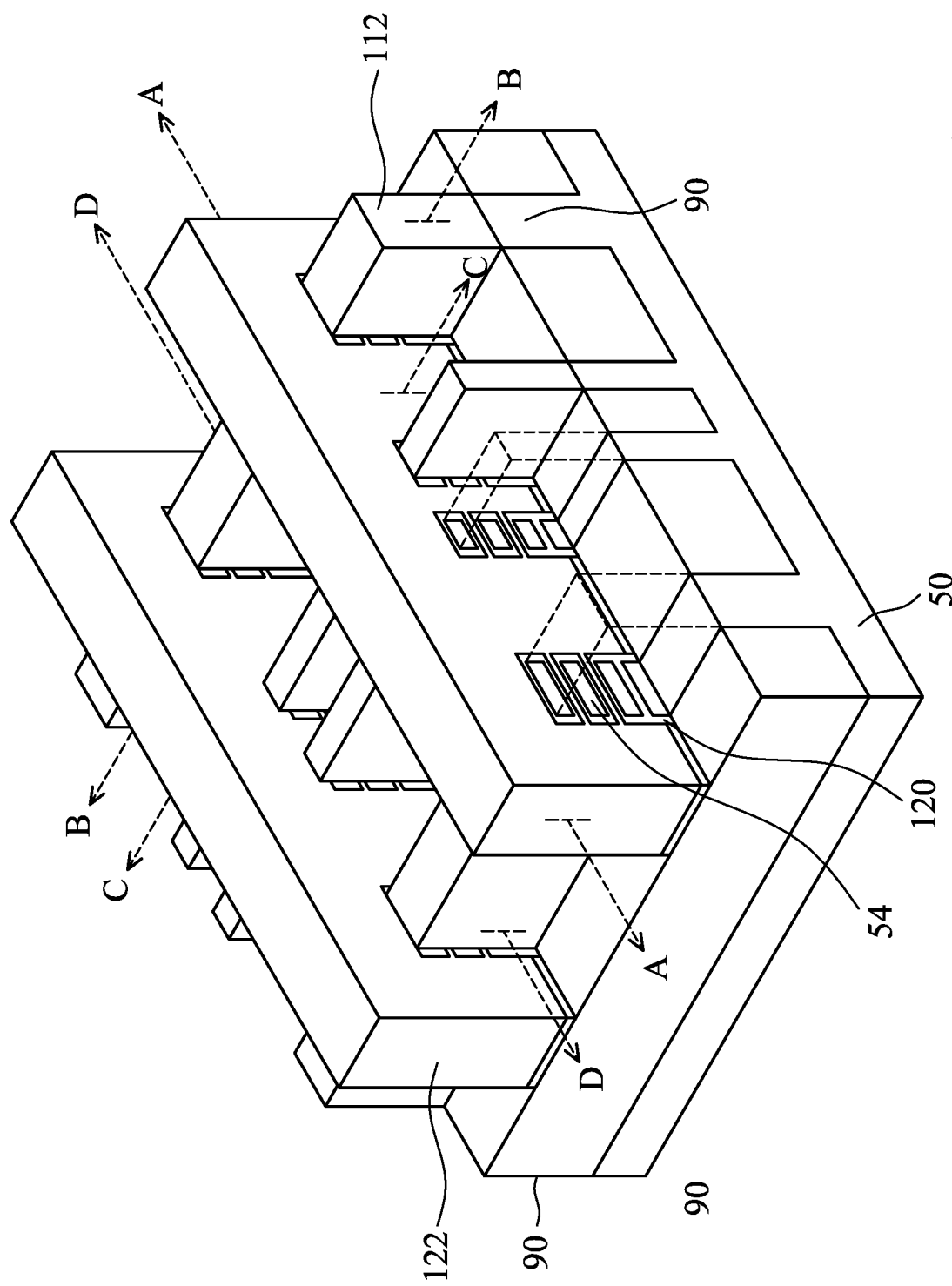
FIG. 1 illustrates an example of a nanostructure field-effect transistor (NSFET) device in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a multi-layer stack is formed over a substrate. The multi-layer stack comprises alternating layers of a first semiconductor material and a second semiconductor material. The multi-layer stack and the substrate are next patterned to form a fin, where the patterned multi-layer stack forms a layer stack of the fin, and a patterned portion of the substrate forms a semiconductor strip of the fin underlying the layer stack. A dummy gate structure is formed over the fin. Openings are formed on opposing sides of the dummy gate structure. Next, end portions of the first semiconductor material exposed by the openings are removed to form recesses, and inner spacers are formed in the recesses. Next, source/drain regions are formed in the openings. A replacement gate process is then performed to replace the dummy gate structure with a metal gate structure. To perform the replacement gate process, the dummy gate structure is removed first, and the first and second semiconductor materials under the dummy gate structure are exposed. A first etching process (e.g., a selective etching process) is performed to remove the first semiconductor material, and the second semiconductor material forms the channel regions of the semiconductor device. The channel regions have a first shape after the first etching process. Next, a second etching process (e.g., another selective etching process) different from the first etching process is performed to re-shape the channel regions. For example, center portions of the channel regions are thinned while the end portions of the channel region remain substantially unchanged. In an embodiment, the channel regions have a rectangular shaped cross-section after the first etching process and before the second etching process, and have a dumbbell shaped cross-section after the second etching process, where the cross-sections are taken along a longitudinal axis of the fin. The dumbbell shaped cross-section decreases a thickness of the channel region for easier control (e.g., turn on or turn off) of the channel regions by the metal gate around the channel regions. In addition, the increased distance between channel regions allows for easier formation of the gate dielectric material around the channel regions.

FIG. 1 illustrates an example of a nanostructure field-effect transistor (NSFET) device in a three-dimensional view, in accordance with some embodiments. The NSFET device comprises semiconductor fins (also referred to as fins) protruding above a substrate 50, where each semiconductor fin includes a semiconductor strip 90 and nanostructures 54 overlying the semiconductor strips 90. A gate electrode 122 (e.g., a metal gate) is disposed over the fins, and source/drain regions 112 are formed on opposing sides of the gate electrode 122. The nanostructures 54 are disposed over the semiconductor strips 90 and between source/drain regions 112. Isolation regions 96 are formed on opposing sides of the fins. A gate dielectric layer 120 is formed around the nanostructures 54. Gate electrodes 122 are over and around the gate dielectric layer 120.

FIG. 1 further illustrates reference cross-sections that are used in later figures. Cross-section A-A is along a longitudinal axis of a gate electrode 122 and in a direction, for example, perpendicular to the direction of current flow between the source/drain regions 112 of a NSFET device. Cross-section B-B is perpendicular to cross-section A-A and is along a longitudinal axis of a fin and in a direction of, for example, a current flow between the source/drain regions 112 of the NSFET device. Cross-section C-C is parallel to cross-section B-B and between two neighboring fins. Cross-section D-D is parallel to cross-section A-A and extends through source/drain regions 112 of the NSFET device. Subsequent figures refer to these reference cross-sections for clarity.

FIGS. 2, 3A, 3B, 4A, 4B, 5A-5C, 6A-6C, 7A-7C, 8A, 8B, 9A, 9B, 10A, 10B, 11A, 11B, 12A, and 12B are cross-sectional views of a nanostructure field-effect transistor (NSFET) device 100 at various stages of manufacturing, in accordance with at least one embodiment.

Figure 2:
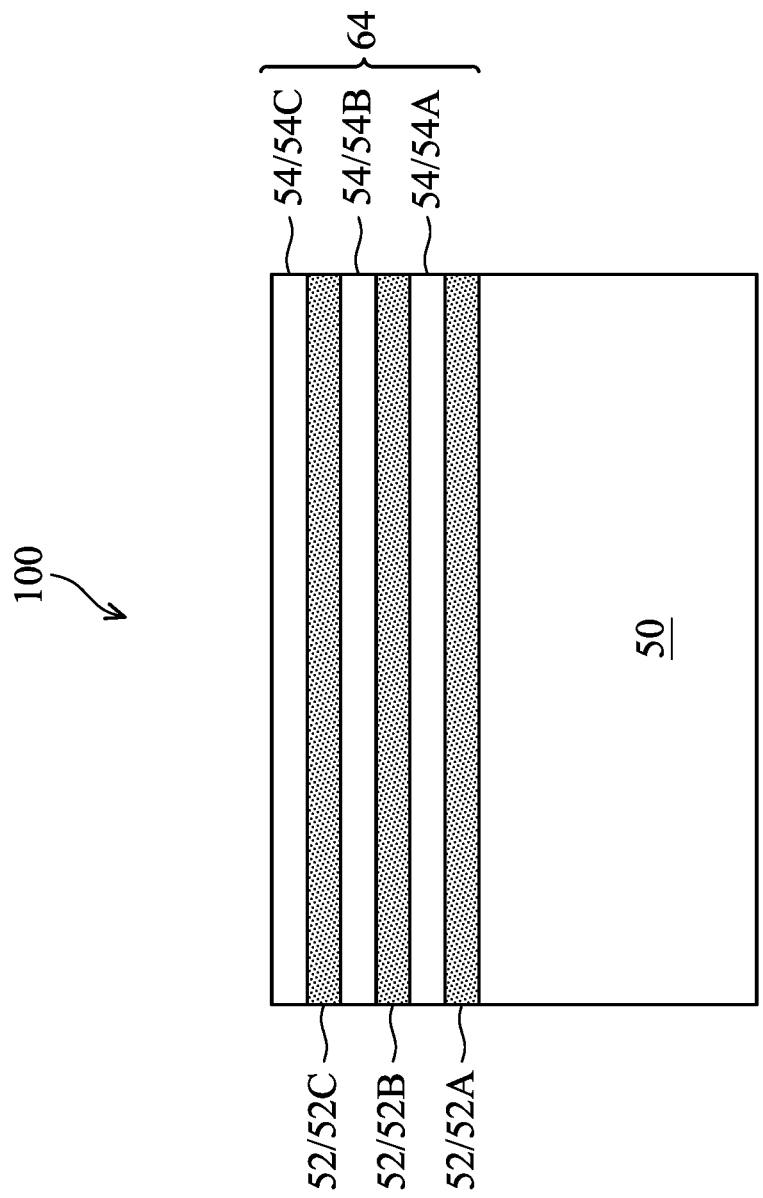

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon substrate or a glass substrate. Other substrates, such as a multi-layered or gradient substrate may also be used. In some embodiments, the semiconductor material of the substrate 50 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

A multi-layer stack 64 is formed on the substrate 50. The multi-layer stack 64 includes alternating layers of a first semiconductor material 52 and a second semiconductor material 54. In FIG. 2, layers formed by the first semiconductor material 52 are labeled as 52A, 52B, and 52C, and layers formed by the second semiconductor material 54 are labeled as 54A, 54B, and 54C. The number of layers formed by the first and the semiconductor materials illustrated in FIG. 2 are merely non-limiting examples. Other numbers of layers are also possible and are fully intended to be included within the scope of the present disclosure.

In some embodiments, the first semiconductor material 52 is an epitaxial material appropriate for forming channel regions of p-type FETs, such as silicon germanium ($Si_xGe_{1-x}$, where x can be in the range of 0 to 1), and the second semiconductor material 54 is an epitaxial material appropriate for forming channel regions of n-type FETs, such as silicon. The multi-layer stacks 64 (which may also be referred to as an epitaxial material stack) will be patterned to form channel regions of an NSFET in subsequent processing. In particular, the multi-layer stacks 64 will be patterned and etched to form horizontal nanostructures (e.g., nanosheets or nanowires), with the channel regions of the resulting NSFET including multiple horizontal nanostructures.

The multi-layer stacks 64 may be formed by an epitaxial growth process, which may be performed in a growth chamber. During the epitaxial growth process, the growth chamber is cyclically exposed to a first set of precursors for selectively growing the first semiconductor material 52, and then exposed to a second set of precursors for selectively growing the second semiconductor material 54, in some embodiments. The first set of precursors includes precursors for the first semiconductor material (e.g., silicon germanium), and the second set of precursors includes precursors for the second semiconductor material (e.g., silicon). In some embodiments, the first set of precursors includes a silicon precursor (e.g., silane) and a germanium precursor (e.g., a germane), and the second set of precursors includes the silicon precursor but omits the germanium precursor. The epitaxial growth process may thus include continuously enabling a flow of the silicon precursor to the growth chamber, and then cyclically: (1) enabling a flow of the germanium precursor to the growth chamber when growing the first semiconductor material 52; and (2) disabling the flow of the germanium precursor to the growth chamber when growing the second semiconductor material 54. The cyclical exposure may be repeated until a target quantity of layers is formed.

FIGS. 3A, 3B, 4A, 4B, 5A-5C, 6A-6C, 7A-7C, 8A, 8B, 9A, 9B, 10A, 10B, 11A, 11B, 12A, and 12B are cross-sectional views of the NSFET device 100 at subsequent stages of manufacturing, in accordance with an embodiment. FIGS. 3A, 4A, 5A, 6A, 7A, 8A, 9A, 10A, 11A, and 12A are cross-sectional views along cross-section B-B in FIG. 1. FIGS. 3B, 4B, 5C, 6C, 7C, 8B, 9B, 10B, 11B, and 12B are cross-sectional views along cross-section A-A in FIG. 1. FIGS. 5B, 6B, and 7B are cross-sectional views along cross-section D-D in FIG. 1. Although two fins and two gate structures are illustrated in the figures as a non-limiting example, it should be appreciated that other numbers of fins and other numbers of gate structures may also be formed.

Figure 3B:
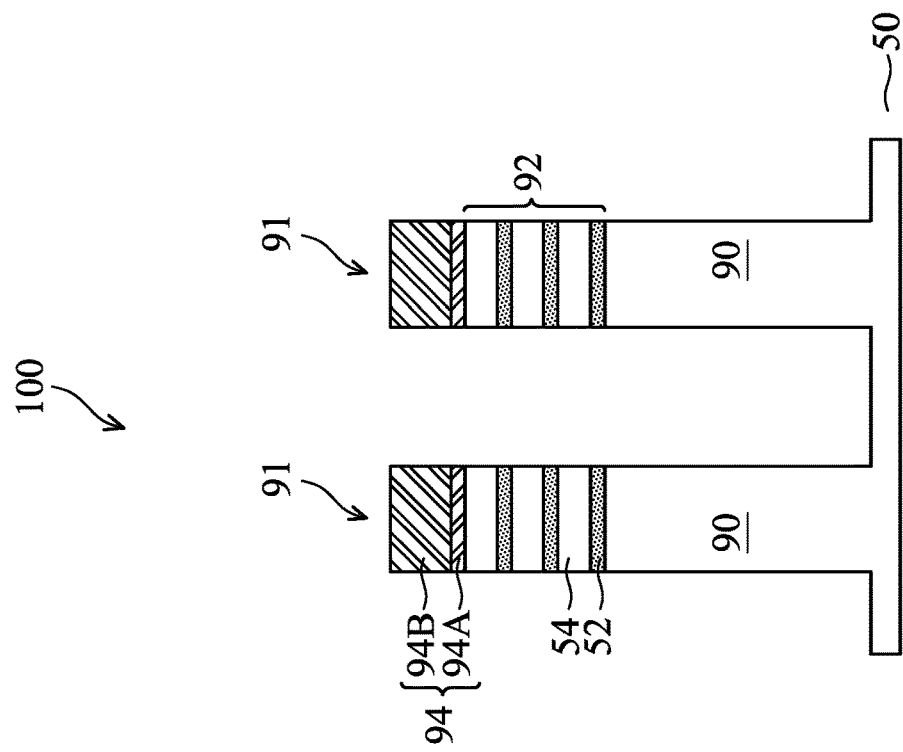
Figure 3A:
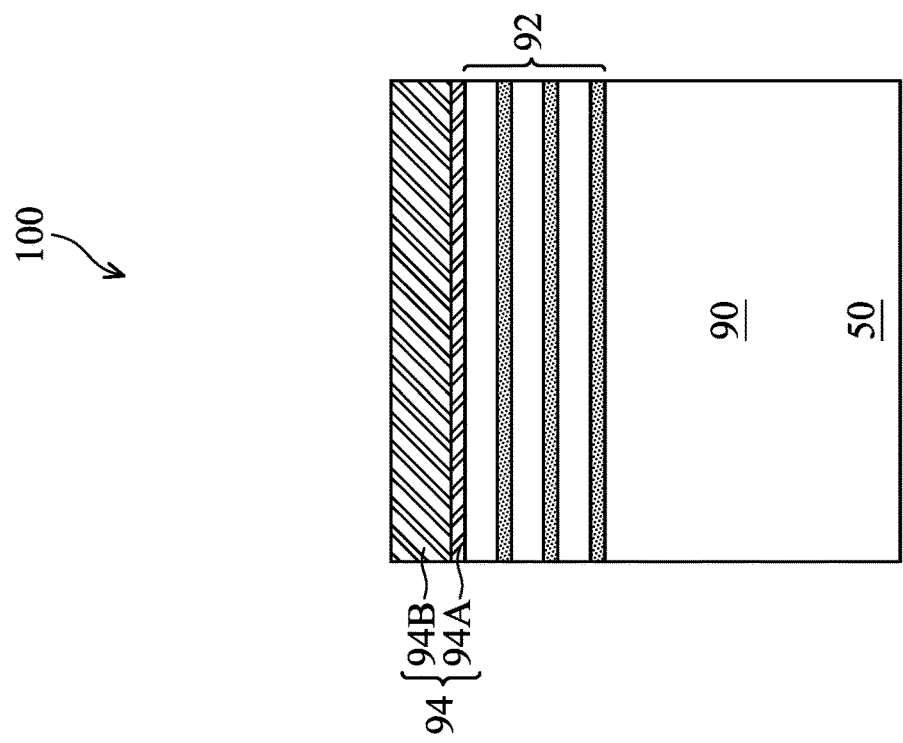

In FIGS. 3A and 3B, fins 91 are formed protruding above the substrate 50. Each of the fins 91 includes a semiconductor strip 90 and a layer stack 92 overlying the semiconductor strip 90. The layer stack 92 and the semiconductor strip 90 may be formed by etching trenches in the multi-layer stack 64 and the substrate 50, respectively. The layer stack 92 and the semiconductor strip 90 may be formed by a same etching process.

The fins 91 may be patterned by any suitable method. For example, the fins 91 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern, e.g., the fins 91.

In some embodiments, the remaining spacers are used to pattern a mask 94, which is then used to pattern the fins 91. The mask 94 may be a single layer mask, or may be a multilayer mask such as a multilayer mask that includes a first mask layer 94A and a second mask layer 94B. The first mask layer 94A and second mask layer 94B may each be formed from a dielectric material such as silicon oxide, silicon nitride, a combination thereof, or the like, and may be deposited or thermally grown according to suitable techniques. The first mask layer 94A and second mask layer 94B are different materials having a high etching selectivity. For example, the first mask layer 94A may be silicon oxide, and the second mask layer 94B may be silicon nitride. The mask 94 may be formed by patterning the first mask layer 94A and the second mask layer 94B using any acceptable etching process. The mask 94 may then be used as an etching mask to etch the substrate 50 and the multi-layer stack 64. The etching may be any acceptable etch process, such as a reactive ion etch (RIE), neutral beam etch (NBE), the like, or a combination thereof. The etching is an anisotropic etching process, in some embodiments. After the etching process, the patterned multi-layer stack 64 forms the layer stack 92, and the patterned substrate 50 forms the semiconductor strip 90, as illustrated in FIGS. 3A and 3B. Therefore, in the illustrated embodiment, the layer stack 92 also includes alternating layers of the first semiconductor material 52 and the second semiconductor material 54, and the semiconductor strip 90 is formed of a same material (e.g., silicon) as the substrate 50.

Figure 4B:
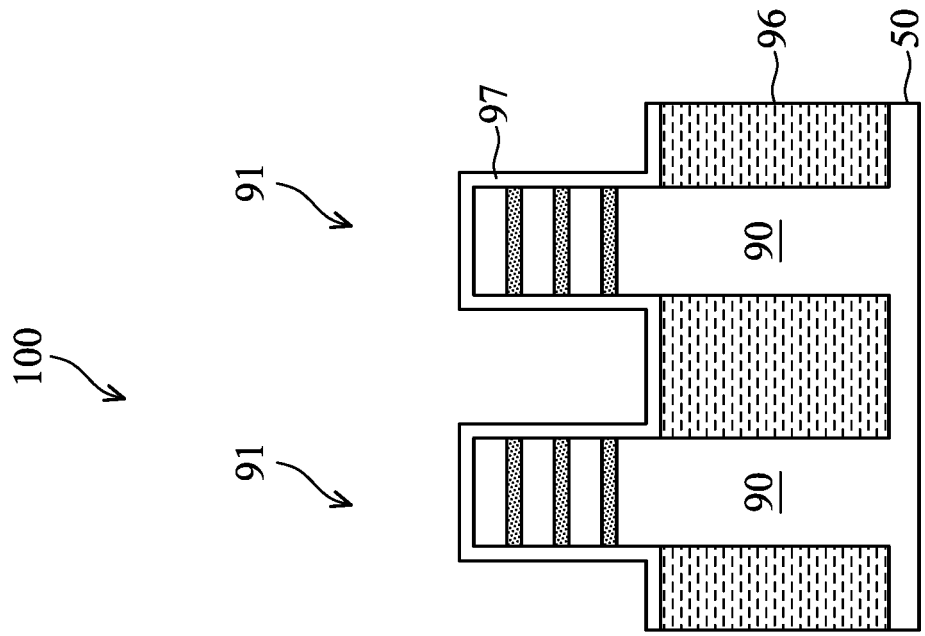
Figure 4A:
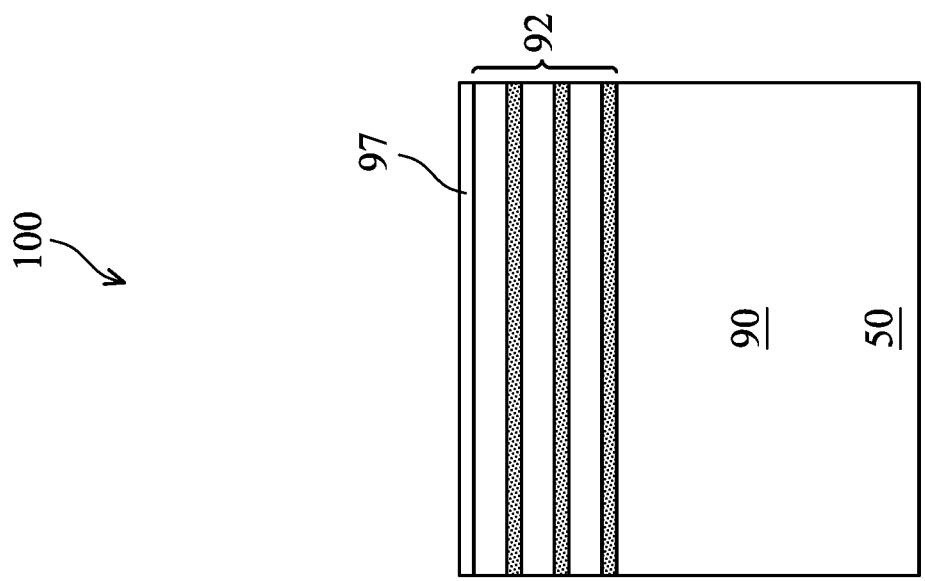

Next, in FIGS. 4A and 4B, Shallow Trench Isolation (STI) regions 96 are formed over the substrate 50 and on opposing sides of the fins 91. As an example to form the STI regions 96, an insulation material may be formed over the substrate 50. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by an FCVD process. An anneal process may be performed after the insulation material is formed.

In some embodiments, the insulation material is formed such that excess insulation material covers the fins 91. In some embodiments, a liner is first formed along surfaces of the substrate 50 and fins 91, and a fill material, such as those discussed above is formed over the liner. In some embodiments, the liner is omitted.

Next, a removal process is applied to the insulation material to remove excess insulation material over the fins 91. In some embodiments, a planarization process such as a chemical mechanical polish (CMP), an etch back process, combinations thereof, or the like may be utilized. The planarization process exposes the layer stacks 92 such that top surfaces of the layer stacks 92 and the insulation material are level after the planarization process is complete. Next, the insulation material is recessed to form the STI regions 96. The insulation material is recessed such that the layer stacks 92 protrude from between neighboring STI regions 96. Top portions of the semiconductor strips 90 may also protrude from between neighboring STI regions 96. Further, the top surfaces of the STI regions 96 may have a flat surface as illustrated, a convex surface, a concave surface (such as dishing), or a combination thereof. The top surfaces of the STI regions 96 may be formed flat, convex, and/or concave by an appropriate etch. The STI regions 96 may be recessed using an acceptable etching process, such as one that is selective to the material of the insulation material (e.g., etches the material of the insulation material at a faster rate than the material of the semiconductor strip 90 and the layer stack 92). For example, a chemical oxide removal with a suitable etchant such as dilute hydrofluoric (dHF) acid may be used.

Still referring to FIGS. 4A and 4B, a dummy dielectric layer 97 is formed over the layer stack 92 and over the STI regions 96. The dummy dielectric layer 97 may be, for example, silicon oxide, silicon nitride, a combination thereof, or the like, and may be deposited or thermally grown according to acceptable techniques. In an embodiment, a layer of silicon is conformally formed over the layer stack 92 and over the upper surface of the STI regions 96, and a thermal oxidization process is performed to convert the deposited silicon layer into an oxide layer as the dummy dielectric layer 97.

Next, in FIGS. 5A-5C, dummy gates 102 are formed over the fins 91. To form the dummy gates 102, a dummy gate layer may be formed over the dummy dielectric layer 97. The dummy gate layer may be deposited over the dummy dielectric layer 97 and then planarized, such as by a CMP. The dummy gate layer may be a conductive material and may be selected from a group including amorphous silicon, polycrystalline-silicon (polysilicon), poly-crystalline silicon-germanium (poly-SiGe), or the like. The dummy gate layer may be deposited by physical vapor deposition (PVD), CVD, sputter deposition, or other techniques known and used in the art. The dummy gate layer may be made of other materials that have a high etching selectivity from the isolation regions 96.

Masks 104 are then formed over the dummy gate layer. The masks 104 may be formed from silicon nitride, silicon oxynitride, combinations thereof, or the like, and may be patterned using acceptable photolithography and etching techniques. In the illustrated embodiment, the mask 104 includes a first mask layer 104A (e.g., a silicon oxide layer) and a second mask layer 104B (e.g., a silicon nitride layer). The pattern of the masks 104 is then transferred to the dummy gate layer by an acceptable etching technique to form the dummy gates 102, and then transferred to the dummy dielectric layer by acceptable etching technique to form dummy gate dielectrics 97. The dummy gates 102 cover respective channel regions of the layer stacks 92. The pattern of the masks 104 may be used to physically separate each of the dummy gates 102 from adjacent dummy gates. The dummy gates 102 may also have a lengthwise direction substantially perpendicular to the lengthwise direction of the fins 91. The dummy gate 102 and the dummy gate dielectric 97 are collectively referred to as dummy gate structure, in some embodiments.

Next, a gate spacer layer 108 is formed by conformally depositing an insulating material over the layer stacks 92, STI regions 96, and dummy gates 102. The insulating material may be silicon nitride, silicon carbonitride, a combination thereof, or the like. In some embodiments, the gate spacer layer 108 includes multiple sublayers. For example, a first sublayer (sometimes referred to as a gate seal spacer layer) may be formed by thermal oxidation or a deposition, and a second sublayer (sometimes referred to as a main gate spacer layer) may be conformally deposited on the first sublayer.

FIGS. 5B and 5C illustrate cross-sectional views of the NSFET device 100 in FIG. 5A along cross-sections E-E and F-F in FIG. 5A, respectively. The cross-sections E-E and F-F correspond to cross-sections D-D and A-A in FIG. 1, respectively.

Next, in FIGS. 6A-6C, the gate spacer layers 108 are etched by an anisotropic etching process to form gate spacers 108. The anisotropic etching process may remove horizontal portions of the gate spacer layer 108 (e.g., portions over the STI regions 96 and dummy gates 102), with remaining vertical portions of the gate spacer layer 108 (e.g., along sidewalls of the dummy gates 102 and the dummy gate dielectric 97) forming the gate spacers 108.

FIGS. 6B and 6C illustrate cross-sectional views of the NSFET device 100 in FIG. 6A along cross-sections E-E and F-F, respectively. In FIG. 6B, portions of the gate spacer layer 108 are illustrated between neighboring fins on the upper surface of the STI regions 96. Those portions of the gate spacer layer 108 may be left because the anisotropic etching process discussed above may not completely remove the gate spacer layer 108 disposed between neighboring fins, due to the smaller distance between the neighboring fins. In other embodiments, the portions of the gate spacer layer 108 disposed on the upper surface of the STI regions 96 between neighboring fins are completely removed by the anisotropic etching process to form the gate spacers 108.

After the formation of the gate spacers 108, implantation for lightly doped source/drain (LDD) regions (not shown) may be performed. Appropriate type (e.g., p-type or n-type) impurities may be implanted into the exposed layer stacks 92 and/or semiconductor strips 90. The n-type impurities may be any suitable n-type impurities, such as phosphorus, arsenic, antimony, or the like, and the p-type impurities may be any suitable p-type impurities, such as boron, $BF_2$, indium, or the like. The lightly doped source/drain regions may have a concentration of impurities of from about $10^{15}$ $cm^{-3}$ to about $10^{16}$ $cm^{-3}$. An anneal process may be used to activate the implanted impurities.

Next, openings 110 (which may also be referred to as recesses) are formed in the layer stacks 92. The openings 110 may extend through the layer stacks 92 and into the semiconductor strips 90. The openings 110 may be formed by any acceptable etching technique, using, e.g., the dummy gates 102 as an etching mask.

After the openings 110 are formed, a selective etching process is performed to recess end portions of the first semiconductor material 52 exposed by the openings 110 without substantially attacking the second semiconductor material 54. After the selective etching process, recesses are formed in the first semiconductor material 52 at locations where the removed end portions used to be.

Next, an inner spacer layer is formed (e.g., conformally) in the opening 110. The inner spacer layer also fills the recesses in the first semiconductor material 52 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. Next, an etching process, such as an anisotropic etching process, is performed to remove portions of the inner spacer layers disposed outside the recesses in the first semiconductor material 52. The remaining portions of the inner spacer layers (e.g., portions disposed inside the recesses in the first semiconductor material 52) form the inner spacers 55. FIGS. 6B and 6C illustrate cross-sectional views of the NSFET device 100 in FIG. 6A along cross-sections E-E and F-F in FIG. 6A, respectively.

Next, in FIGS. 7A-7C, source/drain regions 112 are formed in the openings 110. In the illustrated embodiment, the source/drain regions 112 are formed of an epitaxial material(s), and therefore, may also be referred to as epitaxial source/drain regions 112. In some embodiments, the epitaxial source/drain regions 112 are formed in the openings 110 to exert stress in the respective channel regions of the NSFET device formed, thereby improving performance. The epitaxial source/drain regions 112 are formed such that each dummy gate 102 is disposed between respective neighboring pairs of the epitaxial source/drain regions 112. In some embodiments, the gate spacers 108 are used to separate the epitaxial source/drain regions 112 from the dummy gates 102 by an appropriate lateral distance so that the epitaxial source/drain regions 112 do not short out subsequently formed gates of the resulting NSFET device.

The epitaxial source/drain regions 112 are epitaxially grown in the openings 110. The epitaxial source/drain regions 112 may include any acceptable material, such as appropriate for n-type or p-type device. For example, when n-type devices are formed, the epitaxial source/drain regions 112 may include materials exerting a tensile strain in the channel regions, such as silicon, SiC, SiCP, SiP, or the like. Likewise, when p-type devices are formed, the epitaxial source/drain regions 112 may include materials exerting a compressive strain in the channel regions, such as SiGe, SiGeB, Ge, GeSn, or the like. The epitaxial source/drain regions 112 may have surfaces raised from respective surfaces of the fins and may have facets.

The epitaxial source/drain regions 112 and/or the fins may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 112 may be in situ doped during growth.

As a result of the epitaxy processes used to form the epitaxial source/drain regions 112, upper surfaces of the epitaxial source/drain regions 112 have facets which expand laterally outward beyond sidewalls of the fins 91. In the illustrated embodiment, adjacent epitaxial source/drain regions 112 remain separated (see FIG. 7B) after the epitaxy process is completed. In other embodiments, these facets cause adjacent epitaxial source/drain regions 112 of a same NSFET to merge.

Next, a contact etch stop layer (CESL) 116 is formed (e.g., conformally) over the source/drain regions 112 and over the dummy gate 102, and a first inter-layer dielectric (ILD) 114 is then deposited over the CESL 116. The CESL 116 is formed of a material having a different etch rate than the first ILD 114, and may be formed of silicon nitride using PECVD, although other dielectric materials such as silicon oxide, silicon oxynitride, combinations thereof, or the like, and alternative techniques of forming the CESL 116, such as low pressure CVD (LPCVD), PVD, or the like, could alternatively be used.

The first ILD 114 may be formed of a dielectric material, and may be deposited by any suitable method, such as CVD, plasma-enhanced CVD (PECVD), or FCVD. Dielectric materials for the first ILD 114 may include silicon oxide, Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. FIGS. 7B and 7C illustrate cross-sectional views of the NSFET device 100 of FIG. 7A, but along cross-section E-E and F-F in FIG. 7A, respectively.

Figure 8A:
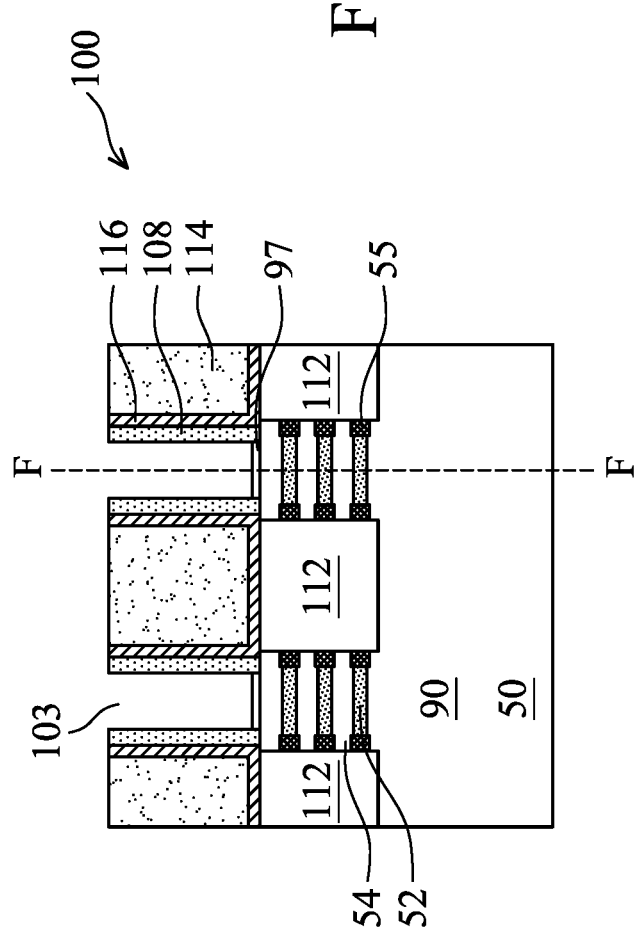
Figure 8B:
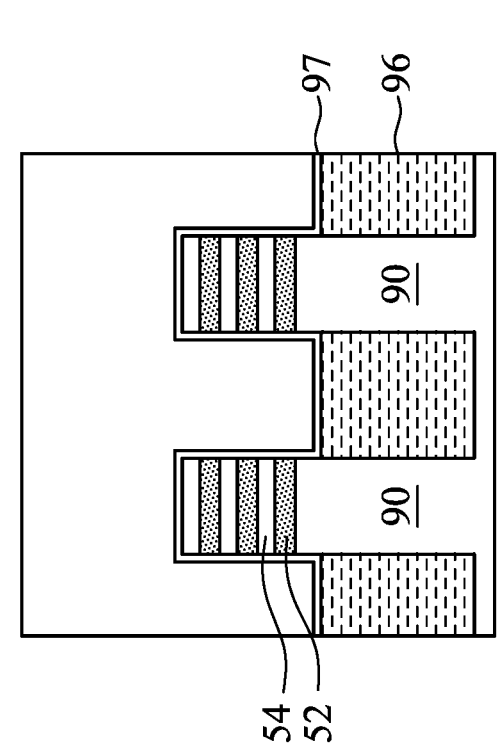

Next, in FIGS. 8A and 8B, the dummy gates 102 are removed. To remove the dummy gates 102, a planarization process, such as a CMP, is performed to level the top surfaces of the first ILD 114 and CESL 116 with the top surfaces of the dummy gates 102 and gate spacers 108. The planarization process may also remove the masks 104 (see FIG. 7A) on the dummy gates 102, and portions of the gate spacers 108 along sidewalls of the masks 104. After the planarization process, top surfaces of the dummy gates 102, gate spacers 108, and first ILD 114 are level. Accordingly, the top surfaces of the dummy gates 102 are exposed through the first ILD 114.

Next, the dummy gates 102 are removed in an etching step(s), so that recesses 103 are formed. In some embodiments, the dummy gates 102 are removed by an anisotropic dry etch process. For example, the etching process may include a dry etch process using reaction gas(es) that selectively etch the dummy gates 102 without etching the first ILD 114 or the gate spacers 108. Each recess 103 exposes a channel region of the NSFET. Each channel region is disposed between neighboring pairs of the epitaxial source/drain regions 112. During the removal of the dummy gates 102, the dummy gate dielectric 97 may be used as an etch stop layer when the dummy gates 102 are etched. The dummy gate dielectric 97 may then be removed after the removal of the dummy gates 102. FIG. 8B illustrates the cross-sectional view of the NSFET device 100 of FIG. 8A along the cross-section F-F.

Next, in FIGS. 9A and 9B, the dummy gate dielectric 97 in the recesses 103 is removed. An etching process, such as an isotropic etching process, may be performed to remove the dummy gate dielectric 97. In an embodiment, an isotropic etching process using an etching gas that comprises HF and $NH_3$ is performed to remove the dummy gate dielectric 97.

Figure 10A:
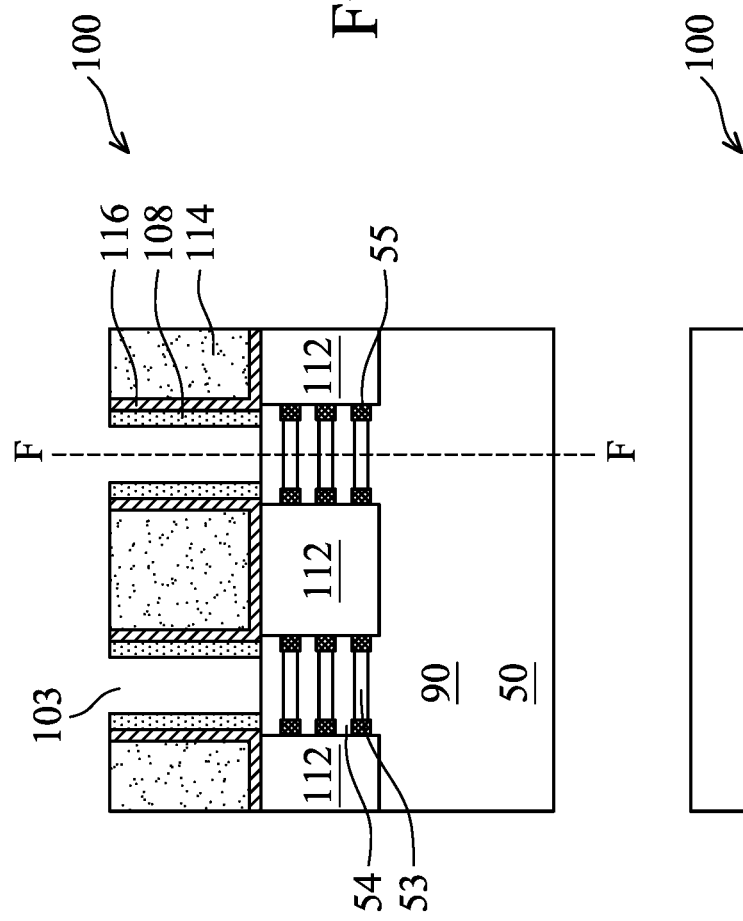
Figure 10B:
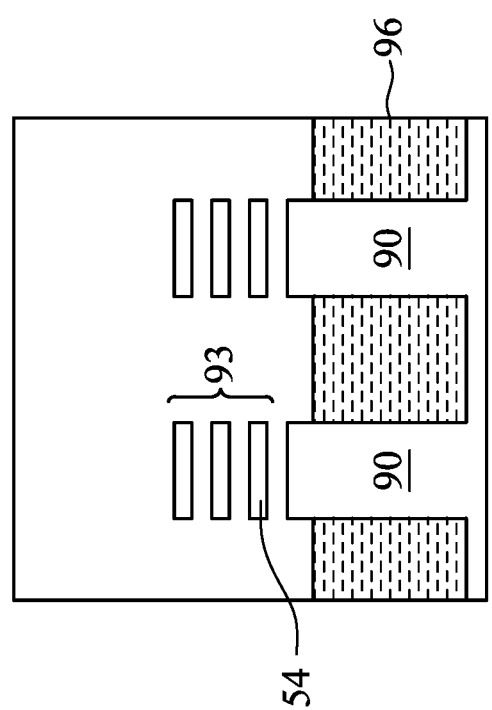

Next, in FIGS. 10A and 10B, the first semiconductor material 52 is removed to release the second semiconductor material 54. After the first semiconductor material 52 is removed, the second semiconductor material 54 forms a plurality of nanostructures 54 that extend horizontally (e.g., parallel to a major upper surface of the substrate 50). The nanostructures 54 may be collectively referred to as the channel regions 93 or the channel layers 93 of the NSFET device 100 formed. As illustrated in FIG. 10A, gaps 53 (e.g., empty spaces) are formed between the nanostructures 54 by the removal of the first semiconductor material 52. In some embodiments, the nanostructures 54 are nanosheets or nanowires, depending on, e.g., the dimensions (e.g., size and/or aspect ratio) of the nanostructures 54.

In some embodiments, the first semiconductor material 52 is removed by a selective etching process using an etchant that is selective to (e.g., having a higher etch rate for) the first semiconductor material 52, such that the first semiconductor material 52 is removed without substantially attacking the second semiconductor material 54. In some embodiments, an isotropic etching process is performed to remove the first semiconductor material 52. The isotropic etching process is performed using an etching gas, and optionally, a carrier gas, where the etching gas comprises $F_2$ and HF, and the carrier gas may be an inert gas such as Ar, He, $N_2$, combinations thereof, or the like. In an embodiment, a volume mixing ratio (e.g., ratio of volumes) between $F_2$ and HF is between about 1:1 and about 1:40, and a volume percentage of the etching gas (e.g., the mixture of HF and $F_2$) in the total gas (combination of the etching gas and the carrier gas) is between about 1:1 and about 1:10. A pressure of the isotropic etching process is between about 200 mTorr and about 1500 mTorr, a temperature of the isotropic etching process is between about 30° C. and about 50° C., and a duration of the isotropic etching process is between about 20 seconds and about 120 seconds, in an embodiment.

FIG. 10A illustrates the cross-sectional view of the NSFET device 100 along a longitudinal axis of the fin (e.g., along a current flow direction in the fin), and FIG. 10B illustrates the cross-sectional view of the NSFET device 100 along cross-section F-F, which is a cross-section along a direction perpendicular to the longitudinal axis of the fin and across a middle portion of the nanostructure 54.

As illustrated in FIG. 10A, each of the nanostructures 54 has a rectangular shaped cross-section along the longitudinal axis of the fin. Similarly, in FIG. 10B, in a cross-section along a direction perpendicular to the longitudinal axis of the fin and across a middle portion of the nanostructure 54, each of the nanostructures 54 has a rectangular shaped cross-section.

Figure 11A:
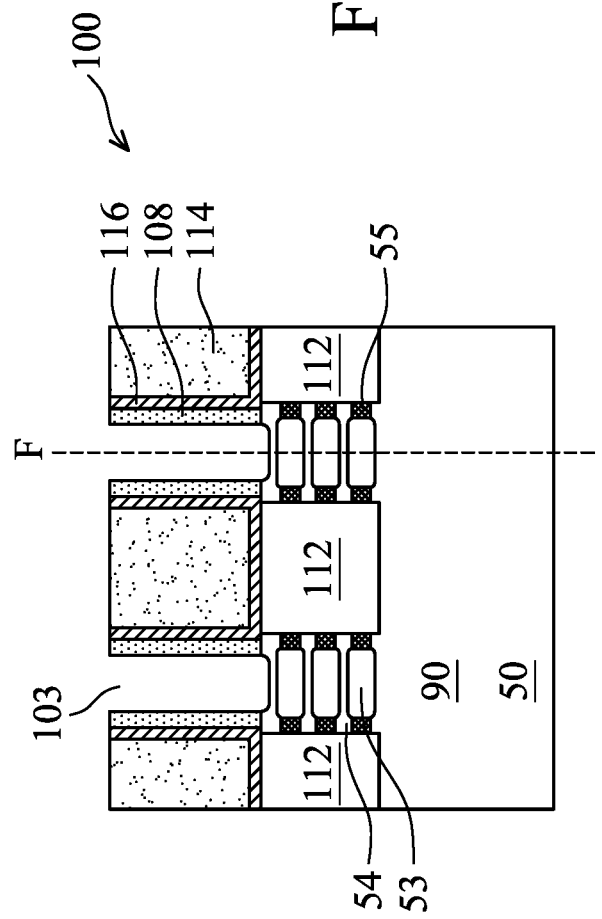
Figure 11B:
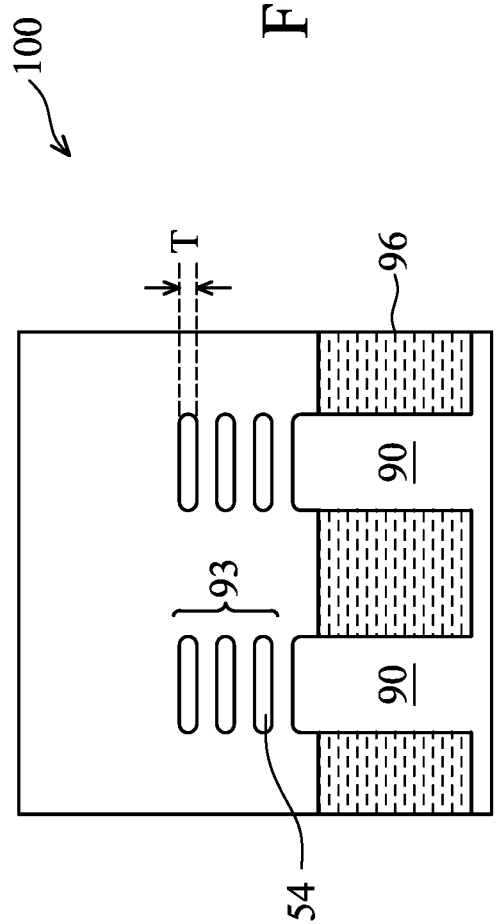

Next, in FIGS. 11A and 11B, the nanostructures 54 are reshaped by a nanostructure reshaping process (e.g., an isotropic etching process). In some embodiments, the nanostructures 54 are reshaped by a selective etching process using an etchant that is selective to the material of the nanostructures 54 (e.g., the second semiconductor material 54), such that the nanostructures 54 are etched without substantially attacking other materials in the NSFET device 100, such as oxide, silicon nitride, and low-K dielectric materials.

In some embodiments, the isotropic etching process (e.g., a selective etching process) to reshape the nanostructures 54 is performed using an etching gas, and optionally, a carrier gas, where the etching gas comprises $F_2$ and $NH_3$, and the carrier gas may be an inert gas such as Ar, He, $N_2$, combinations thereof, or the like. In some embodiments, a volume mixing ratio (e.g., ratio of volumes) between $F_2$ and $NH_3$ is between about 1:4 and about 1:40, and a volume percentage of the etching gas (e.g., the mixture of $F_2$ and $NH_3$) in the total gas (combination of the etching gas and the carrier gas) is between about 1:1 and about 1:10. A pressure of the isotropic etching process is between about 200 mTorr and about 2000 mTorr, a temperature of the isotropic etching process is between about 30° C. and about 50° C., and a duration of the isotropic etching process is between about 10 seconds and about 30 seconds, in some embodiments.

Besides using a mixture of $F_2$ and $NH_3$ as the etching gas, other suitable etching gases, such as $ClF_3$, or a mixture of $NF_3$ and $NH_3$, may alternatively be used as the etching gas to reshape the nanostructures 54. For example, an isotropic etching process (e.g., an isotropic plasma etching process) using an etching gas comprising $NF_3$ and $NH_3$ may be performed to reshape the nanostructures 54.

The nanostructure reshaping process thins the middle portion of each nanostructure 54 while the end portions of the nanostructure 54 remain substantially unchanged, thus generating a dumbbell shaped cross-section for the nanostructure 54 in FIG. 11A. In addition, the nanostructure re-shaping process removes the sharp edges (e.g., see the 90 degree edges of the nanostructures 54 in FIG. 10B) of the nanostructures 54, thus generating rounded edges for each nanostructure 54 (see the rounded corners of each nanostructure 54 in FIG. 11B), as described in more details below.

As illustrated in FIG. 11A, after the nanostructure reshaping process, in the cross-section along the longitudinal axis of the fin, each of the nanostructures 54 has a dumbbell shape, where end portions of the nanostructure 54 (e.g., portions physically contacting the source/drain regions 112) have a thickness (measured along the vertical direction of FIG. 11A) larger than that of the middle portion (e.g., a portion mid-way between the end portions). In some embodiments, a difference between the thicknesses of the end portion of the nanostructure 54 and the middle portion of the nanostructure 54 is between about 0 nm and about 3 nm. In the example of FIG. 11A, the upper surface and the lower surface of the middle portion of each nanostructure 54 are illustrated as level surfaces (e.g., flat surfaces). This is, of course, merely a non-limiting example. In some embodiments, the upper surface and lower surface of the middle portion of each nanostructure 54 are curved, such as curved toward a horizontal center axis of the nanostructure 54. In addition, in the cross-section of FIG. 11B, each of the nanostructures 54 has a stadium shape (may also be referred to as a racetrack shape, a discorectangle shape, an obround shape, or a sausage body shape). In particular, in the cross-section of FIG. 11B, the corners of each nanostructure 54 are rounded (e.g., curved). In some embodiments, a thickness T of the nanostructure 54, measured in the middle portion, is between about 3 nm and about 7 nm.

As feature sizes continue to shrink in advanced processing nodes, the distance between adjacent nanostructures 54 may become so small that it may be difficult to form layers (e.g., gate dielectric layer) around the nanostructures 54 in subsequent processing. By reshaping the nanostructures 54, e.g., thinning the middle portions of the nanostructures 54, the distance between adjacent nanostructures 54 is increased, thus making it easier to form, e.g., gate dielectric layer 120 (see FIGS. 12A and 12B) around the nanostructures 54. In addition, since the thickness T of the nanostructures 54, which form the channel regions 93 of the NSFET device 100, is reduced by the nanostructure reshaping process, it is easier to control (e.g., turning on or off) the NSFET device 100 by applying a gate control voltage on the metal gate formed in subsequent processing.

Figure 12A:
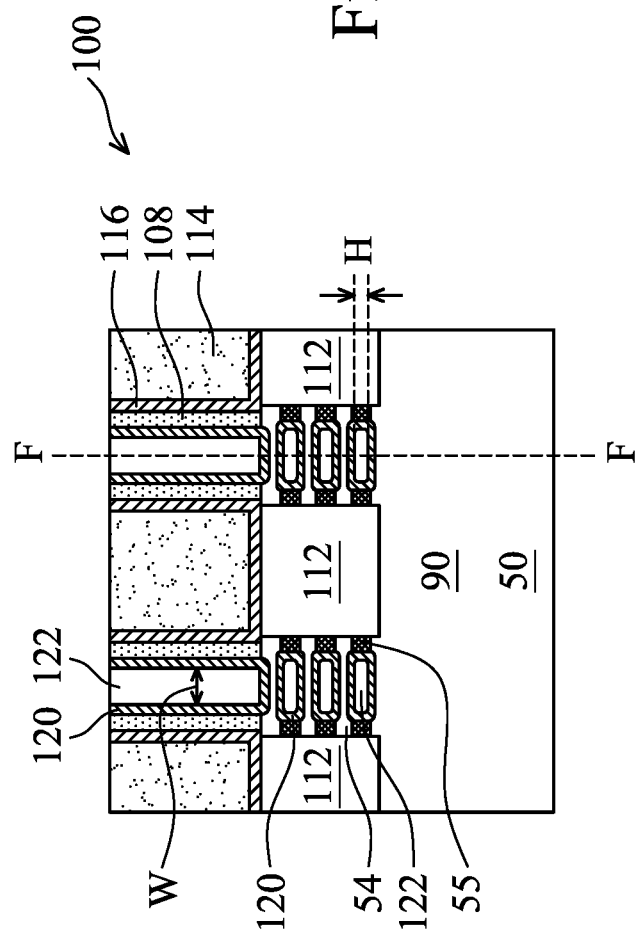
Figure 12B:
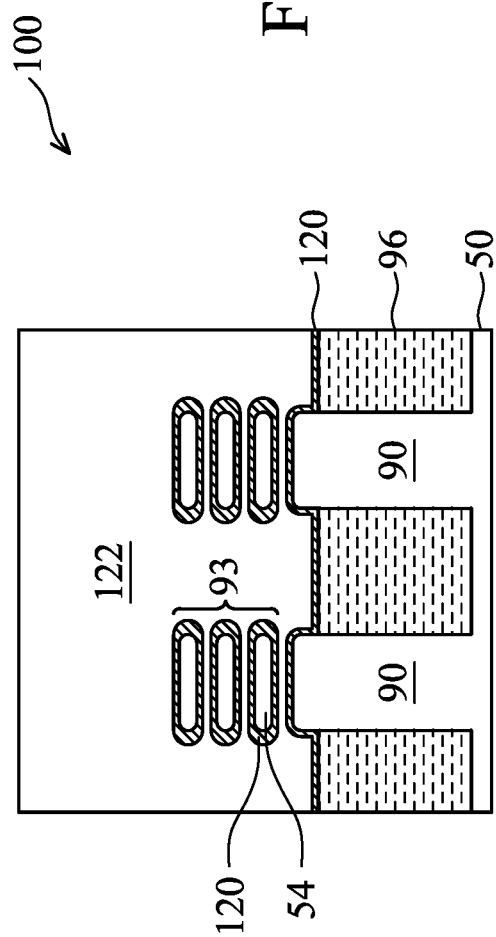

Next, in FIGS. 12A and 12B, gate dielectric layers 120 and gate electrodes 122 are formed for replacement gates. The gate dielectric layers 120 are deposited conformally in the recesses 103, such as on the top surfaces and the sidewalls of the semiconductor strip 90, and on sidewalls of the gate spacers 108. The gate dielectric layers 120 may also be formed on the top surface of the first ILD 114. Notably, the gate dielectric layers 120 wrap around the nanostructures 54. In accordance with some embodiments, the gate dielectric layers 120 comprise silicon oxide, silicon nitride, or multilayers thereof. In some embodiments, the gate dielectric layers 120 include a high-k dielectric material, and in these embodiments, the gate dielectric layers 120 may have a k value greater than about 7.0, and may include a metal oxide or a silicate of Hf, Al, Zr, La, Mg, Ba, Ti, or Pb, or combinations thereof. The formation methods of the gate dielectric layers 120 may include Molecular-Beam Deposition (MBD), ALD, PECVD, and the like.

Next, the gate electrodes 122 are deposited over and around the gate dielectric layers 120, and fill the remaining portions of the recesses 103. The gate electrodes 122 may include a metal-containing material such as TiN, TiO, TaN, TaC, Co, Ru, Al, W, combinations thereof, or multi-layers thereof. For example, although a single layer gate electrode 122 is illustrated, the gate electrode 122 may comprise any number of liner layers (e.g., barrier layers), any number of work function tuning layers, and a fill material. After the filling of the gate electrodes 122, a planarization process, such as a CMP, may be performed to remove the excess portions of the gate dielectric layers 120 and the material of the gate electrodes 122, which excess portions are over the top surface of the first ILD 114. The remaining portions of material of the gate electrodes 122 and the gate dielectric layers 120 thus form replacement gates of the resulting NSFET device 100. Each gate electrode 122 and the corresponding gate dielectric layers 120 may be collectively referred to as a gate stack, a replacement gate structure, or a metal gate structure. Each gate stack extends around the respective nanostructures 54. In the example of FIG. 12A, a width W of the gate electrode 122 (measured horizontally at a location over the source/drain regions 112) is larger than a height H of the gate electrode 122 (measured vertically between the nanostructures 54).

Additional processing may be performed to finish fabrication of the NSFET device 100, as one of ordinary skill readily appreciates, thus details may not be repeated here. For example, a second ILD may be deposited over the first ILD 114. Further, gate contacts and source/drain contacts may be formed through the second ILD and/or the first ILD 114 to electrically couple to the gate electrode 122 and the source/drain regions 112, respectively.

Variations of the disclosed embodiments are possible and are fully intended to be included within the scope of the present disclosure. For example, depending on the type of device (e.g., N-type or P-type device) formed, the second semiconductor material 54 may be removed, and the first semiconductor material 52 may remain to form the nanostructures, which nanostructures function as the channel regions of the NSFET device formed. In embodiments where the first semiconductor material 52 remains to form the nanostructures, inner spacers are formed in recesses in end portions of the second semiconductor material 54 before the second semiconductor material 54 is removed, as one of ordinary skill readily appreciates.

Figure 13:
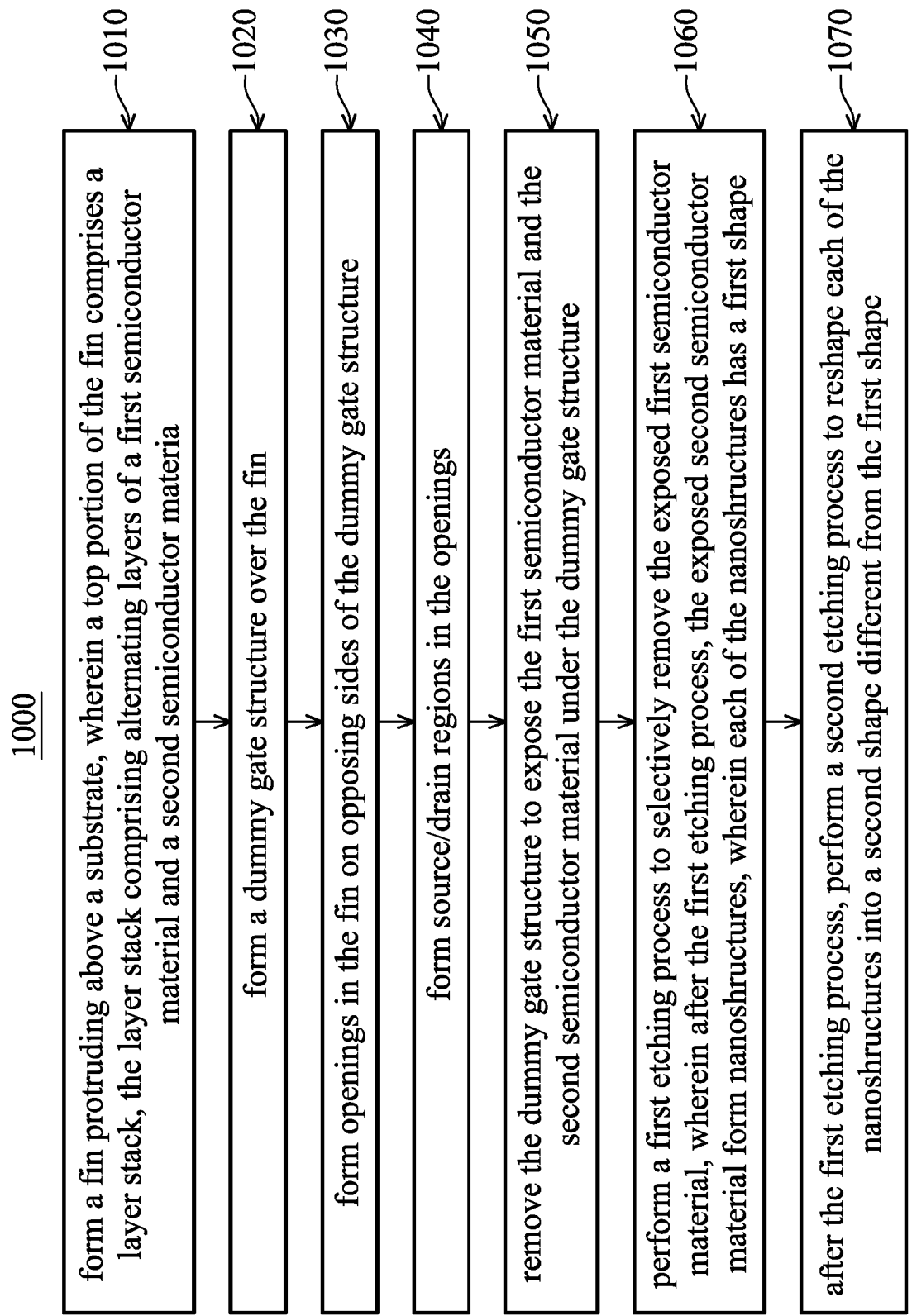
FIG. 13 is a flow chart of a method of forming a semiconductor device, in some embodiments.

FIG. 13 illustrates a flow chart of a method of fabricating a semiconductor device, in accordance with some embodiments. It should be understood that the embodiment method shown in FIG. 13 is merely an example of many possible embodiment methods. One of ordinary skill in the art would recognize many variations, alternatives, and modifications. For example, various steps as illustrated in FIG. 13 may be added, removed, replaced, rearranged, or repeated.

Referring to FIG. 13, at operation 1010, a fin is formed protruding above a substrate, wherein a top portion of the fin comprises a layer stack, the layer stack comprising alternating layers of a first semiconductor material and a second semiconductor material. At operation 1020, a dummy gate structure is formed over the fin. At operation 1030, openings are formed in the fin on opposing sides of the dummy gate structure. At operation 1040, source/drain regions are formed in the openings. At operation 1050, the dummy gate structure is removed to expose the first semiconductor material and the second semiconductor material under the dummy gate structure. At operation 1060, a first etching process is performed to selectively remove the exposed first semiconductor material, wherein after the first etching process, the exposed second semiconductor material form nanostructures, wherein each of the nanostructures has a first shape. At operation 1070, after the first etching process, a second etching process is performed to reshape each of the nanostructures into a second shape different from the first shape.

Embodiments may achieve advantages. The disclosed nanostructure reshaping process thins the nanostructures, thus reducing the thickness T of the channel regions of the NSFET device, thereby making it easier to control (e.g., turning on and off) the NSFET device formed. In addition, the nanostructure reshaping process increases the distance between adjacent nanostructures, making it easier to form subsequent layers (e.g., gate dielectric layer, barrier layer, work function tuning layer) around the nanostructures, thereby increasing the manufacturing yield.

In an embodiment, a method of forming a semiconductor device includes: forming a fin protruding above a substrate, wherein a top portion of the fin comprises a layer stack, the layer stack comprising alternating layers of a first semiconductor material and a second semiconductor material; forming a dummy gate structure over the fin; forming openings in the fin on opposing sides of the dummy gate structure; forming source/drain regions in the openings; removing the dummy gate structure to expose the first semiconductor material and the second semiconductor material under the dummy gate structure; performing a first etching process to selectively remove the exposed first semiconductor material, wherein after the first etching process, the exposed second semiconductor material form nanostructures, wherein each of the nanostructures has a first shape; and after the first etching process, performing a second etching process to reshape each of the nanostructures into a second shape different from the first shape. In an embodiment, the method further includes: after the second etching process, forming a gate dielectric material around the nanostructures; and forming an electrically conductive material around the gate dielectric material. In an embodiment, in a cross-section along a longitudinal axis of the fin, the first shape is a rectangle shape, and the second shape is a dumbbell shape. In an embodiment, in a cross-section perpendicular to a longitudinal axis of the fin and across middle portions of the nanostructures, the first shape is a rectangle shape, and the second shape is a stadium shape. In an embodiment, the first semiconductor material is silicon germanium, and the second semiconductor material is silicon. In an embodiment, the first etching process is performed using a first etching gas, and the second etching process is performed using a second etching gas different from the first etching gas. In an embodiment, the first etching gas comprises $F_2$ and HF, and the second etching gas comprises $F_2$ and $NH_3$, $ClF_3$, or $NF_3$ and $NH_3$. In an embodiment, forming the fin comprises: forming a multi-layer stack over the substrate, the multi-layer stack comprising alternating layers of the first semiconductor material and the second semiconductor material; and patterning the multi-layer stack and the substrate to form the fin, wherein the patterned multi-layer stack forms the layer stack, and the patterned substrate under the layer stack form lower portions of the fin. In an embodiment, forming openings in the fin exposes first sidewalls of the first semiconductor material and exposes second sidewalls of the second semiconductor material, wherein the method further comprises, after forming the openings and before forming the source/drain regions: recessing the first sidewalls of the first semiconductor material to form recesses by performing a selective etching process; and forming inner spacers in the recesses. In an embodiment, forming the inner spacers comprises: forming a conformal inner spacer layer in the openings, wherein the conformal inner spacer layer lines sidewalls and bottoms of the openings and fills the recesses; and performing an anisotropic etching process to remove portions of the conformal inner spacer layers, wherein after the anisotropic etching process, remaining portions of the conformal inner spacer layer in the recesses form the inner spacers. In an embodiment, the method further includes, after forming the source/drain regions and before removing the dummy gate structure, forming a dielectric layer over the source/drain regions and around the dummy gate structure.

In an embodiment, a method of forming a semiconductor device includes: forming a fin over a substrate, the fin comprising a layer stack and a semiconductor layer underlying the layer stack, the layer stack comprising alternating layers of a first semiconductor material and a second semiconductor material; forming a dummy gate structure over the fin; forming source/drain regions over the fin on opposing sides of the dummy gate structure; and replacing the dummy gate structure with a replacement gate structure, wherein replacing the dummy gate structure comprises: removing the dummy gate structure, wherein the first semiconductor material and the second semiconductor material under the dummy gate structure are exposed after removing the dummy gate structure; removing the exposed first semiconductor material using a first etching process, wherein after removing the exposed first semiconductor material, the exposed second semiconductor material form channel regions of the semiconductor device; after the first etching process, reshaping the channel regions using a second etching process different from the first etching process; forming a gate dielectric material around the channel regions; and forming a gate material around the gate dielectric material. In an embodiment, after the first etching process and before the second etching process, the channel regions have a first shape in a first cross-section along a longitudinal axis of the fin, wherein after the second etching process, the channel regions have a second shape in the first cross-section, wherein end portions of the second shape has a same thickness as end portions of the first shape, wherein a middle portion of the second shape is thinner than a middle portion of the first shape. In an embodiment, the first shape is a rectangular shape, and the second shape is a dumbbell shape. In an embodiment, the first semiconductor material comprises silicon germanium, and the second semiconductor material comprises silicon. In an embodiment, the first etching process is performed using a first etching gas comprising $F_2$ and HF, and the second etching process is performed using a second etching gas comprising $F_2$ and $NH_3$, $ClF_3$, or $NF_3$ and $NH_3$. In an embodiment, forming source/drain regions comprises: forming openings in the fin on the opposing sides of the dummy gate structure; performing a selective etching process to remove portions of the first semiconductor material exposed by the opening, wherein the selective etching process forms recesses in the first semiconductor material; forming inner spacers in the recesses; and after forming the inner spacers, growing an epitaxial material in the openings.

In an embodiment, a semiconductor device includes: a fin protruding above a substrate; a gate structure over the fin; source/drain regions in the fin on opposing sides of the gate structure; and channel layers under the gate structure and between the source/drain regions, wherein the channel layers are substantially parallel to each other and are separated by inner spacers disposed in between, wherein each of the channel layers has end portions contacting the source/drain regions and has a middle portion between the end portions, wherein the end portions have a first thickness larger than a second thickness of the middle portion. In an embodiment, in a first cross-section along a longitudinal axis of the fin, each of the channel layers has a dumbbell shape. In an embodiment, in a second cross-section perpendicular to the first cross-section and across the middle portion of each of the channel layers, each of the channel layers has a stadium shape.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a fin protruding above a substrate, wherein a top portion of the fin comprises a layer stack, the layer stack comprising alternating layers of a first semiconductor material and a second semiconductor material;
   forming a dummy gate structure over the fin;
   forming source/drain regions in the fin on opposing sides of the dummy gate structure;
   removing the dummy gate structure to expose the first semiconductor material and the second semiconductor material under the dummy gate structure;
   selectively removing the exposed first semiconductor material by performing a first etching process, wherein after the first etching process, the second semiconductor material remains to form nanostructures; and
   after the first etching process, increasing distances between adjacent nanostructures by performing a second etching process different from the first etching process, wherein the first etching process is performed using a first etchant selective to the first semiconductor material, and the second etching process is performed using a second etchant selective to the second semiconductor material, wherein the first etchant comprises $F_2$ and HF, and the second etchant comprises $NF_3$ and $NH_3$, wherein after the first etching process and before the second etching process, a middle portion of each of the nanostructures has a first shape in a first cross-section along a direction perpendicular to a longitudinal axis of the fin, wherein after the second etching process, the middle portion of each of the nanostructures has a second shape in the first cross-section, wherein the first shape is a rectangular shape, and the second shape is an obround shape.

2. The method of claim 1, wherein the first semiconductor material is silicon germanium, and the second semiconductor material is silicon.

3. The method of claim 1, wherein after the first etching process and before the second etching process, each of the nanostructures has a third shape in a second cross-section along the longitudinal axis of the fin, wherein after the second etching process, each of the nanostructures has a fourth shape in the second cross-section, the third shape being different from the fourth shape.

4. The method of claim 3, wherein the third shape is a rectangular shape, and the fourth shape is a dumbbell shape.

5. The method of claim 1, further comprising:
   after the second etching process, forming a gate dielectric material around the nanostructures; and
   forming a gate electrode around the gate dielectric material.

6. The method of claim 1, wherein forming the fin comprises:
   forming a multi-layer stack over the substrate, the multi-layer stack comprising alternating layers of the first semiconductor material and the second semiconductor material; and
   patterning the multi-layer stack and the substrate to form the fin.

7. The method of claim 1, further comprising, before removing the dummy gate structure, forming a dielectric layer over the fin around the dummy gate structure.

8. A method of forming a semiconductor device, the method comprising:
   forming a fin over a substrate, the fin comprising a layer stack and a semiconductor layer underlying the layer stack, the layer stack comprising alternating layers of a first semiconductor material and a second semiconductor material;
   forming a dummy gate structure over the fin;
   forming source/drain regions over the fin on opposing sides of the dummy gate structure; and
   replacing the dummy gate structure with a replacement gate structure, wherein replacing the dummy gate structure comprises:
      removing the dummy gate structure to expose the first semiconductor material and the second semiconductor material disposed under the dummy gate structure;
      removing the exposed first semiconductor material, wherein after removing the exposed first semiconductor material, the second semiconductor material remains to form channel regions of the semiconductor device;
      after removing the exposed first semiconductor material, reshaping middle portions of the channel regions while keeping end portions of the channel regions intact, wherein the end portions of the channel regions contact the source/drain regions, and the middle portions are between respective ones of the end portions, wherein removing the exposed first semiconductor material is performed using a first etchant selective to the first semiconductor material, wherein the first etchant is a first etching gas comprising $F_2$ and HF, wherein reshaping the middle portions of the channel regions is performed using a second etchant selective to the second semiconductor material, wherein the second etchant is a second etching gas comprising a mixture of $NF_3$ and $NH_3$;
      forming a gate dielectric material around the channel regions; and
      forming a gate material around the gate dielectric material.

9. The method of claim 8, wherein the first semiconductor material comprises silicon germanium, and the second semiconductor material comprises silicon.

10. The method of claim 8, wherein before the reshaping, each of the channel regions has a first shape in a first cross-section along a longitudinal axis of the fin, wherein after the reshaping, each of the channel regions has a second shape in the first cross-section, wherein end portions of the second shape have a same thickness as end portions of the first shape, wherein a thickness of a middle portion of the second shape, measured along a directional perpendicular to a major upper surface of the substrate, is smaller than that of a middle portion of the first shape.

11. The method of claim 10, wherein the first shape is a rectangular shape, and the second shape is a dumbbell shape.

12. The method of claim 8, wherein forming the source/drain regions comprises:
   forming openings in the fin on the opposing sides of the dummy gate structure;
   remove portions of the first semiconductor material exposed by the opening to form recesses in the first semiconductor material;
   forming inner spacers in the recesses; and
   after forming the inner spacers, growing an epitaxial material in the openings.

13. A method of forming a semiconductor device, the method comprising:
- forming a fin over a substrate, the fin comprising a semiconductor strip protruding above the substrate and a layer stack over the semiconductor strip, the layer stack comprising alternating layers of a first semiconductor material and a second semiconductor material;
- forming a dummy gate structure over the fin;
- forming source/drain regions over the fin on opposing sides of the dummy gate structure;
- forming an inter-layer dielectric (ILD) layer over the fin around the dummy gate structure;
- after forming the ILD layer, removing the dummy gate structure to expose the first semiconductor material and the second semiconductor material disposed under the dummy gate structure;
- removing the exposed first semiconductor material using a first etching process, wherein after the first etching process, the remaining second semiconductor material form channel regions of the semiconductor device; and
- after the first etching process, reshaping the channel regions using a second etching process different from the first etching process, wherein reshaping the channel regions comprises reducing thicknesses of middle portions of the channel regions and changing sidewall profiles of the middle portions of the channel regions, wherein a cross-section of the middle portion of each of the channel regions along a direction perpendicular to a longitudinal axis of the fin has a first shape before reshaping the channel regions, and has a second shape after reshaping the channel regions, wherein the first shape is a rectangular shape, and the second shape is a discorectangle shape, wherein the first etching process is performed using a first gas mixture comprising a first etching gas and a first carrier gas, wherein the first etching gas comprising $F_2$ and HF, wherein the second etching process is performed using a second gas mixture comprising a second etching gas and a second carrier gas, wherein the second etching gas comprises $F_2$ and $NH_3$, wherein in the second gas mixture, a volume mixing ratio between $F_2$ and $NH_3$ is between about 1:4 and about 1:40, and a volume percentage of the second etching gas in the second gas mixture is between about 1:1 and about 1:10.

14. The method of claim 13, wherein before reshaping the channel regions, the middle portions of the channel regions have straight sidewalls, wherein after reshaping the channel regions, the middle portions of the channel regions have curved sidewalls.

15. The method of claim 13, wherein the discorectangle shape has two parallel straight lines and two curved lines at opposite ends of the two parallel straight lines, wherein the two curved lines connect the two parallel straight lines.

16. The method of claim 13, wherein in the first gas mixture, a volume mixing ratio between $F_2$ and HF is between about 1:1 and about 1:40, and a volume percentage of the first etching gas in the first gas mixture is between about 1:1 and about 1:10.

17. The method of claim 16, wherein a pressure of the second etching process is between about 200 mTorr and about 2000 mTorr, and a temperature of the second etching process is between about 30° C. and about 50° C.

18. The method of claim 16, wherein a duration of the first etching process is between about 20 seconds and about 120 seconds, and a duration of the second etching process is between about 10 seconds and about 30 seconds.

19. The method of claim 13, wherein the first semiconductor material comprises silicon germanium, and the second semiconductor material comprises silicon.

20. The method of claim 13, wherein during the first etching process, the first etching gas is carried by a first carrier gas, a volume mixing ratio between $F_2$ and HF is between about 1:1 and about 1:40, and a volume percentage of the first etching gas in a first gas mixture is between about 1:1 and about 1:10, wherein the first gas mixture is a mixture of the first etching gas and the first carrier gas.

* * * * *